United States Patent
Lvovsky et al.

(10) Patent No.: US 7,498,810 B2
(45) Date of Patent: Mar. 3, 2009

(54) SYSTEMS, METHODS AND APPARATUS FOR SPECIALIZED MAGNETIC RESONANCE IMAGING WITH DUAL-ACCESS CONICAL BORE

(75) Inventors: Yuri Lvovsky, Florence, SC (US); Peter Jarvis, Florence, SC (US)

(73) Assignee: General Electric Company, Schenectady, NY (US)

(*) Notice: Subject to any disclaimer, the term of this patent is extended or adjusted under 35 U.S.C. 154(b) by 80 days.

(21) Appl. No.: 10/938,030

(22) Filed: Sep. 11, 2004

(65) Prior Publication Data
US 2006/0055406 A1    Mar. 16, 2006

(51) Int. Cl.
*G01V 3/00* (2006.01)
(52) U.S. Cl. .................................... 324/318
(58) Field of Classification Search ................. 324/318, 324/326
See application file for complete search history.

(56) References Cited

U.S. PATENT DOCUMENTS

| | | | | |
|---|---|---|---|---|
| 4,556,848 A | * | 12/1985 | Eberhard | 324/309 |
| 5,307,039 A | * | 4/1994 | Chari et al. | 335/299 |
| 5,646,532 A | | 7/1997 | Knuttel et al. | |
| 5,799,653 A | * | 9/1998 | Carlson | 600/410 |
| 6,278,274 B1 | * | 8/2001 | Biglieri et al. | 324/318 |
| 6,570,475 B1 | * | 5/2003 | Lvovsky et al. | 335/216 |
| 6,611,702 B2 | * | 8/2003 | Rohling et al. | 600/415 |
| 6,806,712 B2 | * | 10/2004 | Akgun | 324/318 |
| 6,870,367 B2 | * | 3/2005 | Kirsch | 324/309 |
| 6,992,486 B2 | * | 1/2006 | Srinivasan | 324/318 |
| 7,009,396 B2 | * | 3/2006 | Zhu et al. | 324/309 |
| 2002/0105402 A1 | * | 8/2002 | Crozier et al. | 335/216 |
| 2006/0038565 A1 | * | 2/2006 | Havens | 324/318 |

* cited by examiner

*Primary Examiner*—Brij Shrivastav
*Assistant Examiner*—Megann Vaughn
(74) *Attorney, Agent, or Firm*—Peter Vogel, Esq.; Jean Tibbetts, Esq.; Michael G. Smith, Esq.

(57) ABSTRACT

An apparatus for magnetic resonance imaging is described having a casing with an inner bore which in some embodiments is substantially frustoconical shape for receiving a subject. The apparatus contains devices disposed in the casing to create a uniform field within an inner bore. The apparatus employs dual access since the inner bore has a first and second end at the outer edge of the casing for which the part of the subject's body would travel so as to be imaged. Further, in some embodiments, the apparatus provides one or more recesses for inserting at least one gradient coils into position about an inner bore. The MRI system induces resonance in selected dipoles in an examination region created along an inner bore of a casing housing in a magnetic resonance imaging system such that the selected dipoles generate magnetic resonance signals to create an image representation of the part of the subject's body.

20 Claims, 6 Drawing Sheets

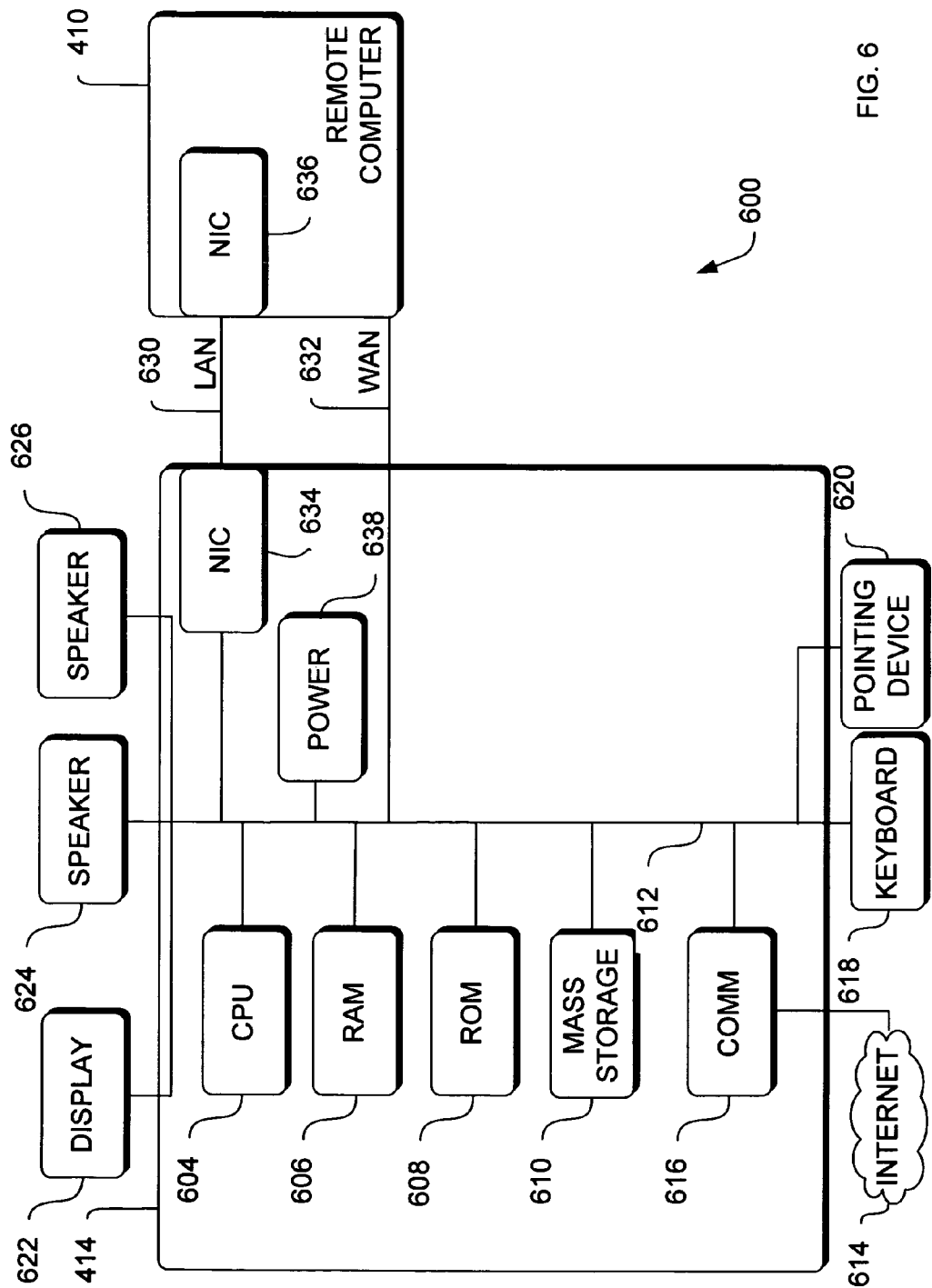

SYSTEMS, METHODS AND APPARATUS FOR SPECIALIZED MAGNETIC RESONANCE IMAGING WITH DUAL-ACCESS CONICAL BORE

FIELD OF THE INVENTION

This invention relates generally to magnetic resonance imaging (MRI) devices, and more particularly to MRI devices designed to image various human extremities.

BACKGROUND OF THE INVENTION

Magnetic resonance imaging (MRI) is a known technique in which an object is placed in a spatially varying magnetic field and subjected to pulses of radiation at a frequency which causes nuclear magnetic resonance in the object, the spectra obtained thereby being processed numerically to form cross-sectional images of the object. MRI imaging is especially useful for medical or veterinary applications, because different living tissues emit different characteristics of resonance signals, thus enabling visualization of the different living tissues in the obtained image. An MRI apparatus thus operates in general by the application of a radio frequency (RF) electromagnetic field in the presence of other magnetic fields, and the subsequent sensing and analysis of the resulting nuclear magnetic resonances induced in the body.

Conventional MRI systems include a main magnet which generates a strong static magnetic field of a high temporal stability and a high spatial homogeneity within a field-of-view (FOV) where the imaging takes place. Conventional MRI systems also include a gradient coil assembly located in the bore between the main magnet and the RF coil and generating space-varying fields. The gradient coil assembly causes the response frequency and phase of the nuclei of the patient body to depend upon position within the FOV thus providing a spatial encoding of the body-emitted signal. Conventional MRI systems further include RF coil/coils arranged within the bore which emit RF waves and receive resonance signal from the body. The superconducting main magnet is typically used to achieve high field strength; it comprises a plurality of concentric coils placed inside a cryostat which is designed to provide a low temperature operating environment for superconducting coils.

Specialized neonatal and orthopedic MRI is intended for imaging human extremities, both legs and arms, and newborn children. Its design takes advantage of small diameter of the bore compared with that in the whole body MRI that has been designed specially for adults. The magnet has to have small size and weight, low fringe field and be easily sitable in an e.g., orthopedic office. For the orthopedic MRI, very important is the short length of the magnet, i.e. the distance from its end (flange) to the imaging center, so that both knee and elbow can reach the FOV and be imaged. The shorter the distance to the FOV, the higher is the percentage of the patient and cases which could be covered without referring to the whole body MRI, including children, shorter extremities, and cases of upper parts of legs and arms. Equally important is to preserve sufficient bore diameter for the access into imaging system.

The length of the magnet is determined by the axial position of the end coils, which correlates with the diameter of the end coils, which in turn determines the bore diameter for the imaging system. The bigger the end coil diameter, the longer must be the axial distance from the end coil to the FOV. To accommodate more customers or patients with thicker extremities, such as larger leg diameter, the magnet would require a longer length, which is a longer distance from the edge to the imaging region, so the cases of shorter extremities as well as images of areas close to the entrance of the imager would be excluded. A particular challenge exists in covering the portion of overweight population with thick and short extremities. More effective design allows achieving higher feasible parameters e.g. higher field; lower cost etc. Every magnet design is a trade-off in parametric space; therefore relaxing one requirement (e.g. diameter at magnet end) allows gains in other areas.

For the reasons stated above, and for other reasons stated below which will become apparent to those skilled in the art upon reading and understanding the present specification, there is a need in the art for MRI system that can accommodate both thicker and shorter extremities with the same imaging system. There is also a need for improved access with FOV adjustments that maintain coil efficiency without the need for costly switching.

BRIEF DESCRIPTION OF THE INVENTION

The above-mentioned shortcomings, disadvantages and problems are addressed herein, which will be understood by reading and studying the following specification.

In one aspect, an apparatus for magnetic resonance imaging is described as having a casing with an inner bore for receiving a subject. The apparatus contains devices, such as coils and/or magnetic elements, disposed in the casing for creating a uniform field within an inner bore. The inner bore has a first and second end at the flanges of the casing from which the part of the subject's body would travel so as to get imaged. The apparatus has a first access plane at the first end of the inner bore that is within a first distance from the uniform field and a second access plane at the second end of the inner bore that is within a second distance from the uniform field. The dual access permits different parts of the subject to be imaged based on generally different distance from the uniform field.

In another aspect, magnetic resonance imaging system is described with a casing having an inner bore having a substantially frustoconical shape for receiving a subject. Further, the MRI system employs devices disposed in the casing for creating a uniform field within the inner bore; a first access plane at the inner bore that is within a first distance from the uniform field, the first access coincides with the widest diameter of the frustoconical shape, and a second access plane at the inner bore that is within a second distance from the uniform field, the second access generally coincides with the narrower diameter of the frustoconical shape.

In yet another aspect, method of magnetic resonance imaging is described by inducing resonance in selected nuclei with non-zero spin in an examination region created along an inner bore of a casing housing a magnetic resonance imaging system such that the selected nuclei generate magnetic resonance signals; inserting part of a subject at a first access plane or a second access plane of a casing having an inner bore, and receiving and processing the magnetic resonance signals generated by inserted part of a subject at a first access plane or a second access plane of a casing having an inner bore. The system reconstructs the processed magnetic resonance signals into an image representation.

In still another aspect, a method of magnetic resonance imaging inserting at least one gradient coil into one or more recesses positioned about the axis of an inner bore of a casing housing a magnetic resonance imaging system. The MRI system induces resonance in selected dipoles in an examination region created along an inner bore of a casing housing a magnetic resonance imaging system such that the selected dipoles generate magnetic resonance signals. Part of a subject is inserted through a first access plane or a second access plane of a casing having an inner bore. The data is then received and processed and reconstruction of the processed magnetic resonance signals into an image representation.

Apparatus, systems, and methods of varying scope are described herein. In addition to the aspects and advantages described in this summary, further aspects and advantages will become apparent by reference to the drawings and by reading the detailed description that follows.

BRIEF DESCRIPTION OF THE DRAWINGS

FIG. 6 is a block diagram of the hardware and operating environment in which different embodiments can be practiced.

DETAILED DESCRIPTION OF THE INVENTION

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical, signal processing and other changes may be made without departing from the scope of the embodiments. The following detailed description is, therefore, not to be taken in a limiting sense.

Figure 1:
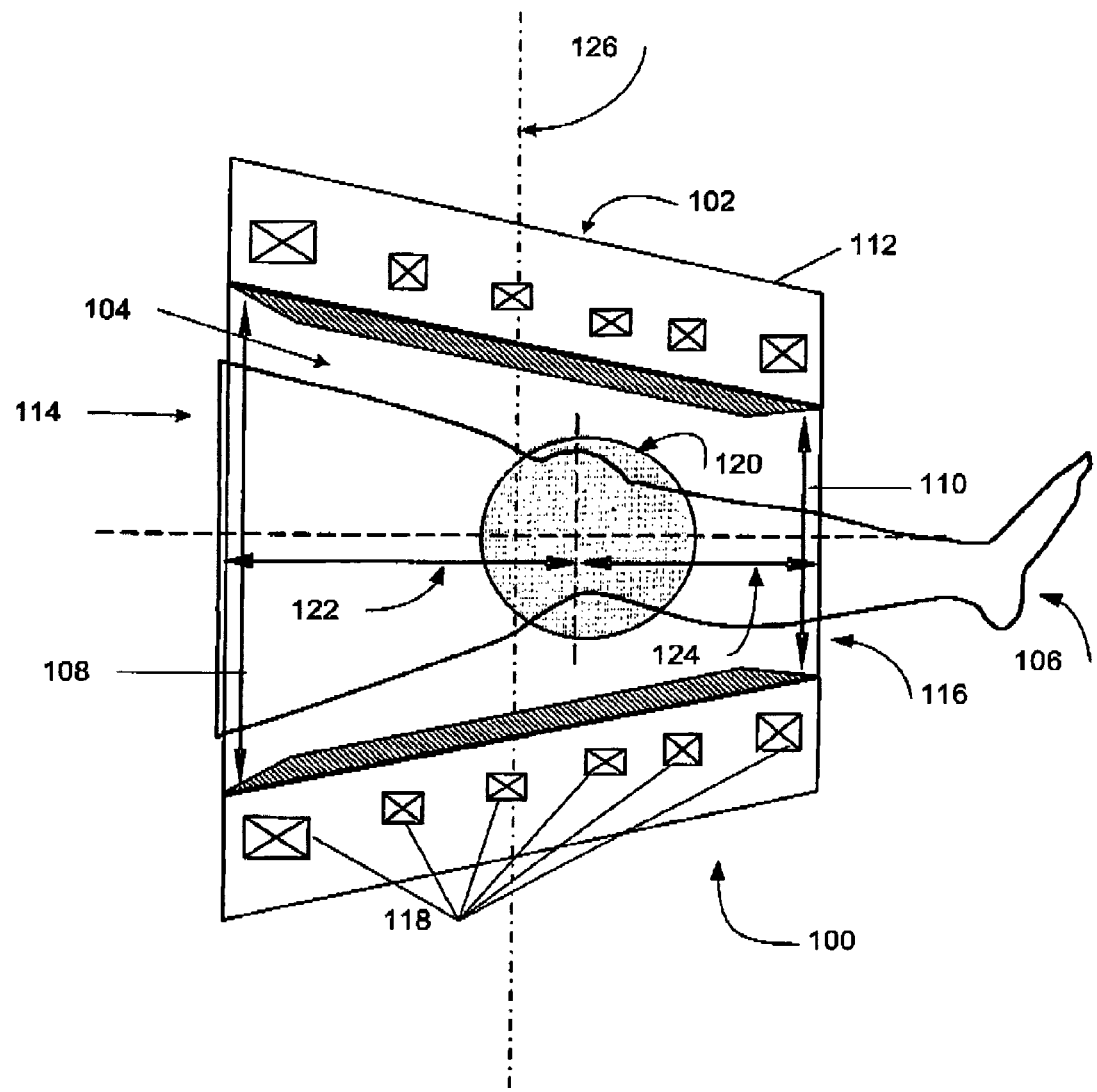
FIG. 1 illustrates an embodiment without active stray field shielding, i.e. with no bucking (shielding) coils.

FIG. 1 provides an overview of a magnetic resonance imaging (MRI) system that provides dual access. System 100 solves the need in the art to accommodate both thicker and shorter extremities in a MRI system.

System 100 includes a casing 102. The casing 102 has an inner bore 104 for receiving a subject 106. The casing 102 contains magnetic field generating devices such as superconducting coils, resistive coils, permanent magnets, or ferromagnetic elements or forms. The inner bore 104 has a first end 108 and a second end 110 at outer perimeter 112 of the casing 102. The magnet half-length in this depiction is labeled 126. The distance between the first end 108 and second end 110 depends on the application for the MRI system 100. For example, in the application to the imaging of extremities like arms and legs a length of about a half (½) a meter to two third (⅔) of a meter generally should suffice. If the MRI system 100 were being applied to whole body adult imaging the length would be in the one and half (1.5) meter range.

System 100 also includes a first access plane 114. The first access plane 114 is an entry portal to the first end 108 of the inner bore 104. System 100 further includes a second access plane 116. The second access plane 116 is an entry portal to a second end 110 of the inner bore 104.

System 100 also includes devices 118 that are disposed in the casing 102 for creating a uniform magnetic field 120 within the inner bore 104. The first access plane 114 has a first distance 122 from the uniform magnetic field 120. The second access plane 116 has a second distance 124 from the uniform field 120. Distances 122 and 124 are generally not equal to each other.

These distances can be selected based on the anatomical extremities to assure that the desired region of interest is within the uniform magnetic field 120. Thus, dual access (114,116) with different distances in turn provides system 100 with the capability to accommodate extremities that may possess different characteristics.

The MRI system 100 may use ferromagnetic shielding (not shown) which may be at room temperature (RT) and may form part of the outer casing, or be part of the imaging room. RT shielding on outside the magnet use less space then the actively-shielded magnet with bucking coils, and provides the opportunity for accommodating second, non-imaged leg or arm. To avoid effect of changing magnetization with ambient temperature, the temperature of the RT shield may be automatically controlled by maintaining it constant, and elevated over that of the room e.g. by using heaters. If RT shielding was used, an asymmetric magnet would exert a non-zero axial force on the symmetric RT shielding thus affecting internal suspension system, the RT shield would be made asymmetric to achieve balanced zero axial force.

The system level overview of the operation of an embodiment has been described in this section of the detailed description. While the system 100 is not limited to any particular casing 102, inner bore 104, subject 106, first end 108, second end 110, outer perimeter 112, first access plane 114, devices 118, a uniform magnetic field 120, first distance 122, or second distance 124, for sake of clarity, a simplified casing 102, inner bore 104, subject 106, first end 108, second end 110, outer perimeter 112, first access plane 114, second access plane 116, devices 118, a uniform magnetic field 120, first distance 122 and second distance 124 have been described.

Figure 2:
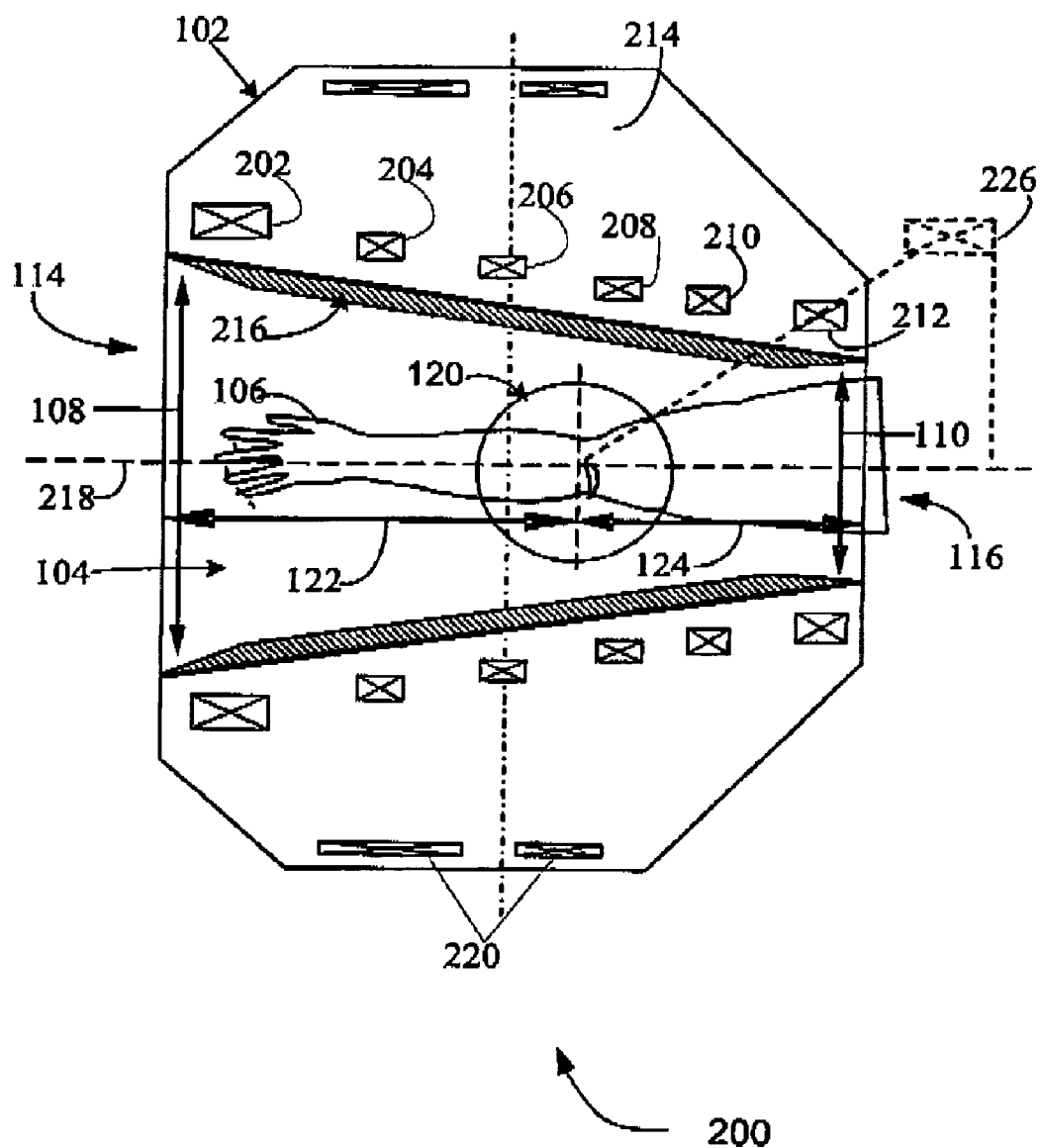
FIG. 2 illustrates an actively-shielded embodiment with bucking coils.

FIG. 2 illustrates an overview of an actively shielded embodiment with bucking coils 220 which control stray field leakage. FIG. 2 provides a dual access (114, 116) MRI system to acquire MRI data for diagnostic and analyses of extremities such as knees and elbows. System 200 solves the need in the art to accommodate thicker and shorter extremities.

FIG. 2 shows an MRI system 200, of an embodiment. The MRI system 200 comprises a shell or casing 102 having a substantially conical inner bore 104. The casing 102 contains magnetic devices such as superconducting coils; it may also include ferromagnetic elements (forms).

The bore 104 is formed along the longitudinal axis 218 of the MRI system 200 and extends from the front face 108 of the MRI system 200 to the rear face 110. The conical bore 104 forms a relatively large opening in the front face 108 and a relatively smaller opening in the rear face 110. The inner surface of the bore 104 accordingly tapers from the large opening to the small opening, thus defining a substantially conical or frustoconical shape bore 104 for which the extremities of the subject 106 may enter for imaging from either direction (108, 110). As is known in the MR imaging field, gradient assembly 216 and RF (not shown) coils are included to obtain the MR image. The gradient assembly 216 typically consists of three sets of gradient coils; two transverse sets producing G.sub.x and G.sub.y, and a longitudinal set producing G.sub.z. Each set of coils typically consist of primary windings and shield windings. The opening of inner bore 104 at the front face 108 of the MRI system 200 has a diameter which is significantly larger than the inner diameter of comparable cylindrical magnet with a constant diameter bore. The center of the FOV 120 is located asymmetrically with respect to the front and rear edges, i.e. closer to the rear face(116) than to the front face(114). Furthermore, the overall length of the MRI system is less than the length of a comparable cylindrical magnet with a constant diameter bore. The combination of the larger opening at the front face 108 allows for larger extremities like a leg to reach the FOV 120. Further, the smaller opening 110 allows for shorter extremities; for example an arm, to reach the uniform field or FOV 120. This arrangement also provides much greater access as the tapered bore 104 is sufficiently large to easily accommodate the legs of a patient through access plane 114.

FIG. 2 shows the actively shielded MRI system. The MRI system 200 preferably comprises superconducting coils 202-212 spaced axisymmetrically along the longitudinal axis 218 of the bore of the MRI system such that the FOV 120 lies inside the coils. This embodiment is not limited to the illustrated number of coils or other magnetic field generating devices; any suitable combination which would produce sufficient field strength and homogeneity could be used.

As seen in the FIG. 2, the coils 202-212 are spaced along the longitudinal axis of the bore in order of generally progressively decreasing diameter. That is, the first coil 202, which is the left most in the FIG. 2, has the largest diameter and each successive coil has a smaller or constant diameter up to the right most coil 212 which has the smallest diameter. However, a strict succession in coil diameters is not a prerequisite for this embodiment. Other design considerations such as structural, cryogenic, etc may affect the chosen location for individual coils. The coils are preferably constructed of a superconducting wire (conductor), which is wound in uniform layers and can be epoxy impregnated. The coils 202-212 may operate in a liquid cryogen or be conductively cooled. The superconducting coils can be constructed either from low temperature superconductors, or from high temperature superconductors, in which case they may be cooled conductively at temperatures above 20K, or cooled with liquid nitrogen or other cryogens.

The superconducting coils 202-212 are enclosed in a cryostat 214, which may generally comprise an outer vacuum vessel, at least one thermal shield and possibly a helium vessel. The inner surface of the cryostat 214 follows the general outline defined by the superconducting coils 202-212, thereby forming the substantially conical shape of the bore 104. The superconducting coils 202-212 are held in position by a support structure (not shown) which is constructed in such a way as to support electromagnetic forces acting between coils. The structure must also maintain the superconducting coils 202-212 in a proper position when cooled to operational temperature. In one embodiment, the superconducting coils 202-212 are wound of NbTi based superconductor and maintained at about ~4K using liquid helium. A two-stage cryocooler such as one operating on the Gifford-McMahon cycle can be used, with its first stage of heat stationed to a thermal shield (not shown), preferably made of aluminum, which surrounds the superconducting coils 202-212. The second stage of the cryocooler can be thermally connected to a heat exchanger which is used to re-condense the helium vapor into liquid helium thus maintaining closed cycle with zero boil-off. Alternatively, a conductively cooled design with superconducting coils 202-212 in a vacuum can be implemented, in which implementation the second stage of the cryocooler is connected to the superconducting coils 202-212 and/or to the structure via conductive thermal pathways, and no helium is used inside cryostat 214. There exist other implementations, including but not limited to high temperature superconducting coils, resistive coils and/or permanent magnets; MRI system 200 is not restricted to the implementations suggested above. The specific constitution of the superconducting coils 202-212, the support structure, and the thermal shield are generally known to those skilled in the art.

The MRI system 200 comprises bucking coils 220 that control leakage of the stray magnetic field to the clinical environment outside the magnet.

The MRI system 200 comprises gradient coils 216. The requirements of the gradient coil assembly 216 are twofold. First, gradient coil assembly 216 is required to produce a substantially linear variation in field along one direction, and secondly to have high efficiency, low inductance and low resistance, in order to minimize the current and voltage requirements and heat dissipation. MRI system 200 shows a uniform magnetic field or FOV 120 of magnetic homogeneity that is formed in a magnetic field space. A part of a subject 106 is inserted into the region through one of the access planes 114 and 116. The distance from the end coil 212 to the imaging center determines the smaller diameter of the bore 104 and the distance which the extremity has to travel (not shown) before reaching the imaging region or FOV 120. This bore diameter 104 is at the second access plane 116 It should be noted that the dimension of the bore in this embodiment is less than in a constant diameter bore system. For example, if coil 212 was moved radially outward to create a constant diameter bore, it would have also to move along the axis from the field of view, and distance to be traveled within the imaging region by the arm would be increased as shown by the translation of coil 212 to position 226. Increases in the opening of the bore 110 and distance to be traveled 124 could exclude shorter extremities from reaching the FOV. However, by maintaining a conical shape arrangement and by inwardly moving coil 212 from position 226, the bore diameter 110 can be altered at one access plane 116 without altering the bore diameter at the other access plane 114. In this way one can insert the other extremity through access plane 116 and not lose the ability to accommodate shorter extremities.

Figure 3:
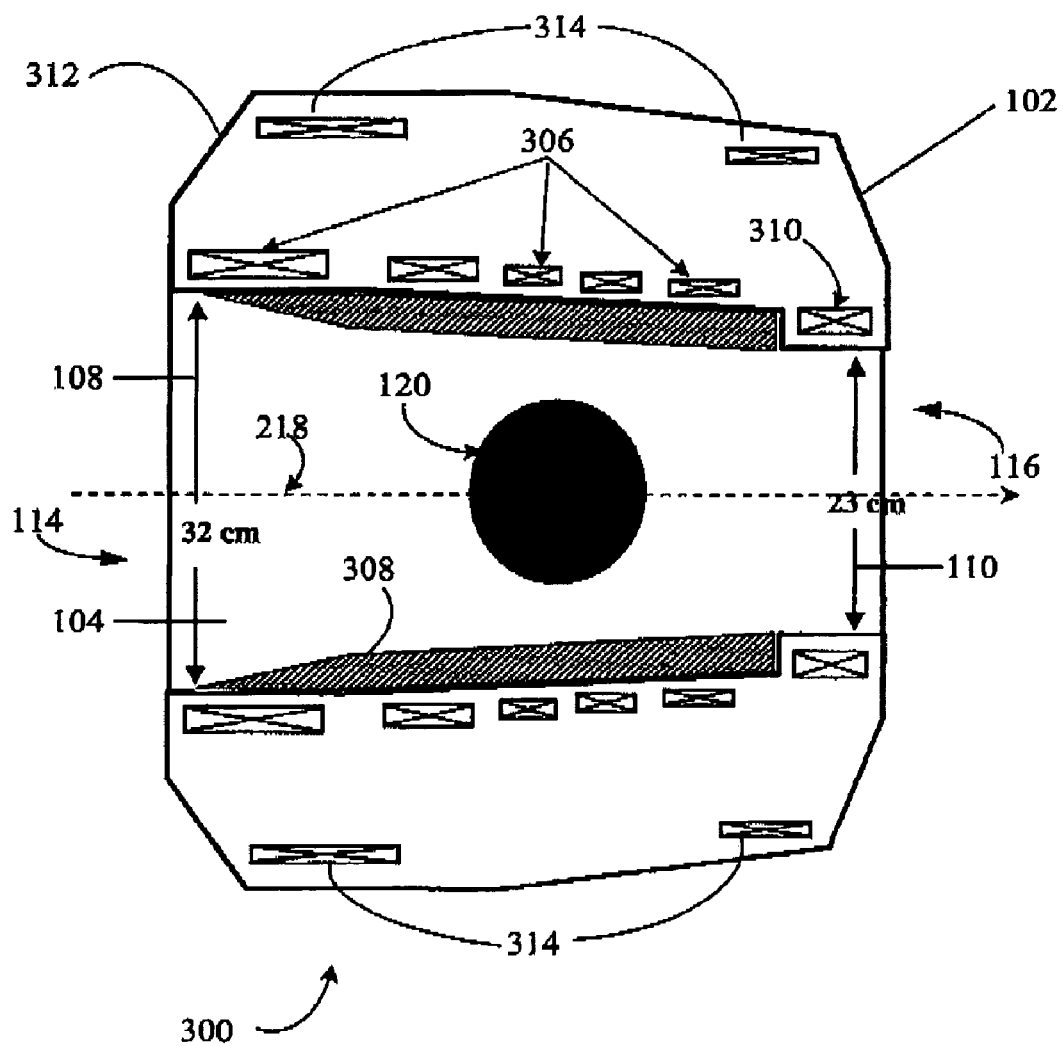
FIG. 3 illustrates an embodiment with recessed gradient assembly.

FIG. 3 shows an embodiment with sunken gradient assembly. FIG. 3 provides a dual access MRI system to acquire MRI data for imaging, diagnostic and analyses of extremities such as knees and elbows. System 300 solves the need in the art to accommodate thicker and shorter extremities.

FIG. 3 shows an MRI system 300, of an embodiment. The MRI system 300 comprises a shell or casing 102 having a substantially conical outer surface. The casing 102 contains magnetic field generating devices such as superconducting coils. It can also contain resistive coils, permanent magnets and/or ferromagnetic elements.

A bore 104 is formed along the longitudinal axis 218 of the MRI system 300 and extends from the front face 108 of the MRI system 300 to the rear face 110. The bore 104 is such that it forms a relatively large opening in the front face 108 and a smaller opening in the rear face 110. The inner surface of the bore 104 accordingly tapers from the large opening 108 to the smaller opening 110, thus defining a substantially conical or frustoconical shape bore for which the extremities of the patient may enter for diagnosis from either direction. The distance between the front face 108 and rearface 110 depends on the application for the MRI system 300. For example, in the application to the imaging if extremities like arms and legs a length of about a half ($\frac{1}{2}$) a meter to two third ($\frac{2}{3}$) of a meter generally should suffice. If the MRI system 200 were being applied to full body imaging the length would be in the one and half (1.5) meters range. As is known in the MR imaging field, RF and gradient coils 308 are included to obtain the MR image. The opening in the front face 108 of the MRI system 300 has a diameter which is significantly larger than the inner diameter of a comparable cylindrical magnet with a constant diameter bore. Furthermore, the overall length of the MRI system is significantly less than the length of a comparable cylindrical magnet with a constant diameter bore. The larger opening 108 at first access plane 114 allows for larger extremities such as a leg to reach the FOV 120. Further, the narrower opening 110 allows for shorter extremities such as an arm to reach the FOV 120. This arrangement also provides greater access because the tapered bore 104 is sufficiently large to accommodate the arms of a patient or subject 106 as shown in FIG. 1

The MRI system 300 preferably comprises superconducting coils 306, 310 spaced axisymmetrically along the longitudinal axis of the bore of the MRI system such that the FOV 120 lies inside the coils. Embodiments are not limited to the illustrated number of coils; any suitable combination of magnetic field generating devices which would produce sufficient field strength and homogeneity could be used. As seen in the FIG. 3, the coils 306 are spaced along the longitudinal axis of the bore in order of generally progressively decreasing diameter. That is, the first coil of 306 which is the left most in the FIG. 3, has the largest diameter and each successive coil has a smaller or constant diameter up to the right most coil which has the smallest diameter. However, a strict succession in coil diameters is not a prerequisite for this embodiment. Other design considerations such as structural, cryogenic, etc may effect the chosen location for individual coils. The coils are preferably constructed of superconducting wire (conductor) such as Cu/NbTi composite, which is wound in uniform layers. The coils may be epoxy impregnated. The coils may operate in liquid cryogen or be conductively cooled. The magnet is enclosed in a vacuum tight vessel 312. The inner surface of the vacuum vessel 312 follows the general outline defined by the superconducting coils, thereby forming the substantially conical shape of the bore.

The coils 306, 310 are held in position by a support structure (not shown) which is constructed in such a way as to support electromagnetic forces acting between coils. The structure must also maintain the coils in proper position when cooled to operational temperature. In one embodiment, the coils are wound of NbTi based superconductor, and maintained at about ~4K using liquid helium. A two-stage cryocooler such as one operating on the Gifford-McMahon cycle can be used, with its first stage of heat stationed to a thermal shield (not shown), preferably made of aluminum, which surrounds the coils. The second stage of the cryocooler can be thermally connected to a heat exchanger which is used to re-condense the helium vapor into liquid helium thus maintaining closed cycle with zero boil-off. Alternatively, a conductively cooled design with coil in vacuum can be implemented, in which implementation the second stage of the cryocooler is connected to the coils and/or to the structure via conductive thermal pathways, and no helium is used inside cryostat. Other embodiments include, but are not limited to: high temperature superconducting coils, resistive coils and/or permanent magnets or ferromagnetic elements; embodiments are not restricted to the implementations suggested above. The specific constitution of the coils, the support structure, and the thermal shield are generally known in the art.

The MRI system 300 comprises gradient assembly 308 for creating fields with substantially linear variation along each of three coordinates X, Y, Z within the FOV 120. The gradient assembly 308 generally consists of three sets of gradient coils; two transverse sets producing G.sub.x and G.sub.y, and a longitudinal set producing G.sub.z. Each set of coils typically consists of a primary winding and a shield winding. The requirements of the gradient assembly 308 are twofold. First, gradient assembly 308 is required to produce a linear variation in field along one direction, and secondly to have high efficiency, low inductance and low resistance, in order to minimize the current requirements and heat deposition. In the orthopedic MRI under consideration, as in any other MRI system 300, part of the bore would be occupied by the gradient assembly 308 and RF coils (not shown), which would reduce patient access diameter. The magnet coils 306, 310, the gradient assembly 308, and RF coils (not shown) have to compete and share the space. If one moved magnet coils to a larger diameter to accommodate gradient assembly 308, it would result in increased amount of conductor, peak field, stresses and risk of the design. Also, larger coil diameter means increased magnet length and distance from the edge to the imaging region. This penalty is different for moving different magnet coils, the biggest penalty being for the outermost largest end coils. The penalty for moving is significantly smaller for the inner, field shaping coils. A solution is to move the field-shaping coils to a larger diameter, with a small penalty for the design, thus creating a recess or slot in which the gradient coils 308 will be mounted. In such case, the gradient coils 308 assembly does not compromise the patient access. In fact, in this arrangement, access from either end 108 or 110 is determined almost entirely by the end magnet coil 306 and 310 inner diameters, not the gradient diameter. This arrangement moves the gradient closer to the coils thus creating more room for patient access.

Further, the gradient can be arranged to cover only some of the coils leading to an increase in aperture 110 without substantially affecting feasibility of the design. In cylindrical MRI magnets with constant bore diameter, however, the gradient recess would be impractical as it is difficult to assemble or insert a rigid gradient structure into the recess. With the proposed conical or frustoconical bore 104 insertion of the gradient assembly from the wide end is simple, and creating a recess brings advantage of a magnet design with an enhanced patient access diameter. Due to the geometry of the bore, the gradient that is inserted from access plane 114 slopes downward until the front edge of the gradient is adjacent to the last coil. The minimal access plane 116 is increased and is closed to radial distance 110 from gradient coils The MRI system 300 comprises bucking coils 314 that control leakage of the magnetic field to the outside. MRI system 300 shows a uniform magnetic field or FOV 120 of magnetic homogeneity is formed in a magnetic field space. A part of a subject 106 is inserted into the region through one of the access planes 114 and 116. The distance from the flange of magnet to the imaging center determines the diameter of the bore and the distance which the extremity has to travel before reaching the imaging region. For example, if coil 310 was moved radially outward to create a constant diameter bore, it would have also to move along the axis from the field of view, and distance to be traveled within the imaging region by the arm would be increased. Increases in the opening of the bore 110 and distance to be traveled would exclude shorter extremities from reaching the FOV. However, by maintaining a conical shape arrangement and by inwardly moving coil 310, the bore diameter 110 can be altered at one access plane (116) without altering the bore diameter at the other access plane(114). In this way one can insert the other extremity through access plane 116 and not lose the ability to accommodate shorter extremities.

Figure 4:
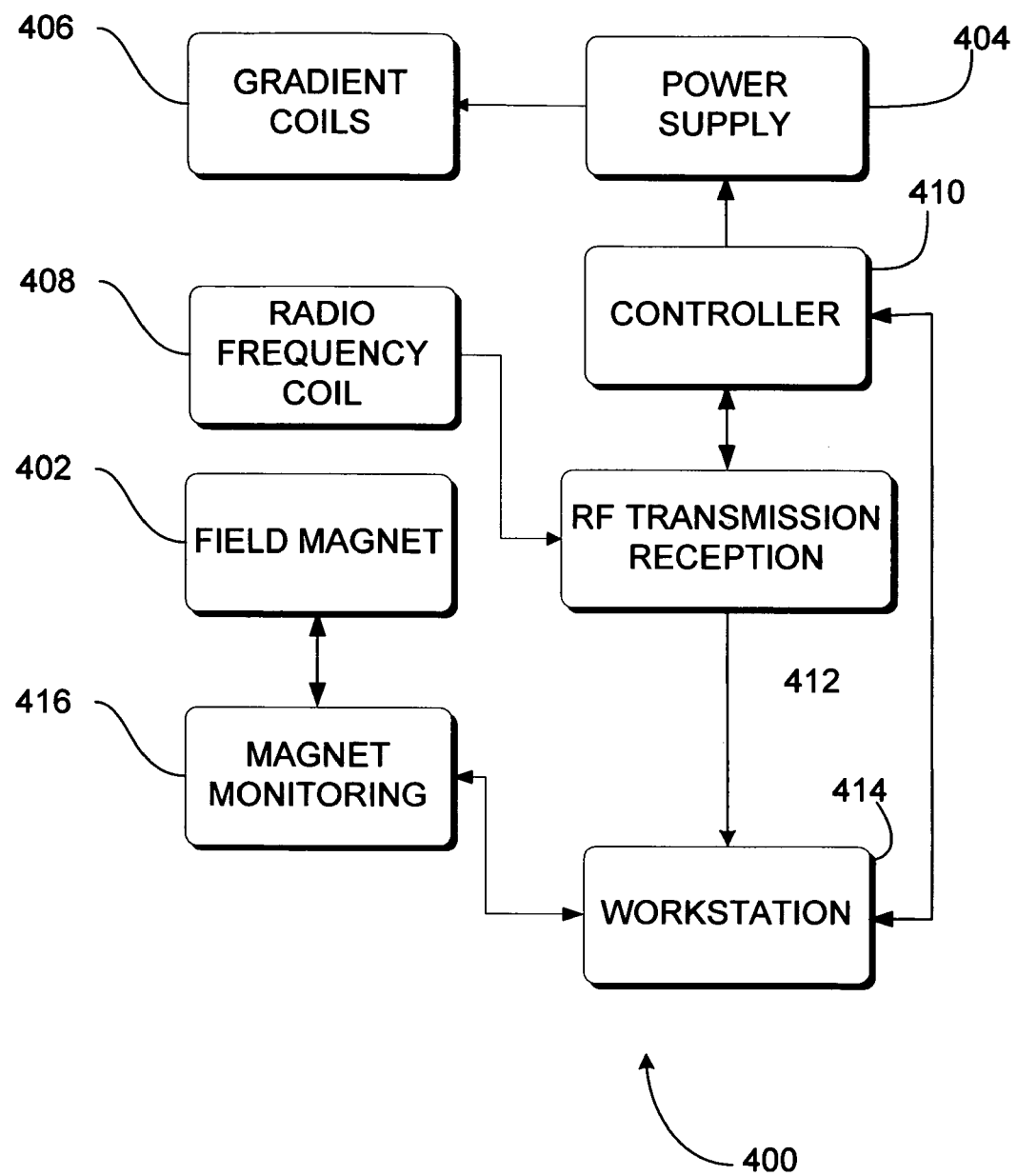
FIG. 4 illustrates an exemplary MRI system, according to an embodiment.

FIG. 4 illustrates an exemplary MRI system, according to an embodiment. Other MRI apparatus are known to those skilled in the art and along with other well-known systems are not illustrated herein for the sake of brevity.

The apparatus 400 includes a basic field magnet 402 supplied by a power supply 404. The system has gradient coils 406 for respectively emitting gradient magnetic fields G sub Z, G sub Y and G sub X, operated by a gradient coils power supply 404. An RF coil assembly 408 is provided for generating the RF pulses, and for receiving the resulting magnetic resonance signals from an object being imaged. The RF coil assembly 408 is operated by an RF transmission/reception unit 412. The RF coil assembly 408 may be employed for transmitting and receiving, or alternatively, separate coils can be employed for transmitting and receiving. The gradient coils power supply 404 and the RF transmission/reception unit 412 are operated by a controller 410 to produce signals such that are directed to the object to be imaged.

Further, the field magnet 402 is persistently monitored by magnet monitoring device 416 to maintain optimal operations of the MRI system such as systems 100, 200, or 300. The magnetic resonance signals received from the RF coil 408 are subject to a transformation process, such as a two-dimensional fast Fourier Transform (FFT), which generates pixelated image data. The transformation may be performed by a workstation 414 or other similar processing device. The image data may then be shown on a display 622. In one example, the MRI apparatus can acquire data according to a planned radial EPI sequence (e.g., Spider, rEPI, radial turbo SE) or any other imaging protocol.

Figure 5:
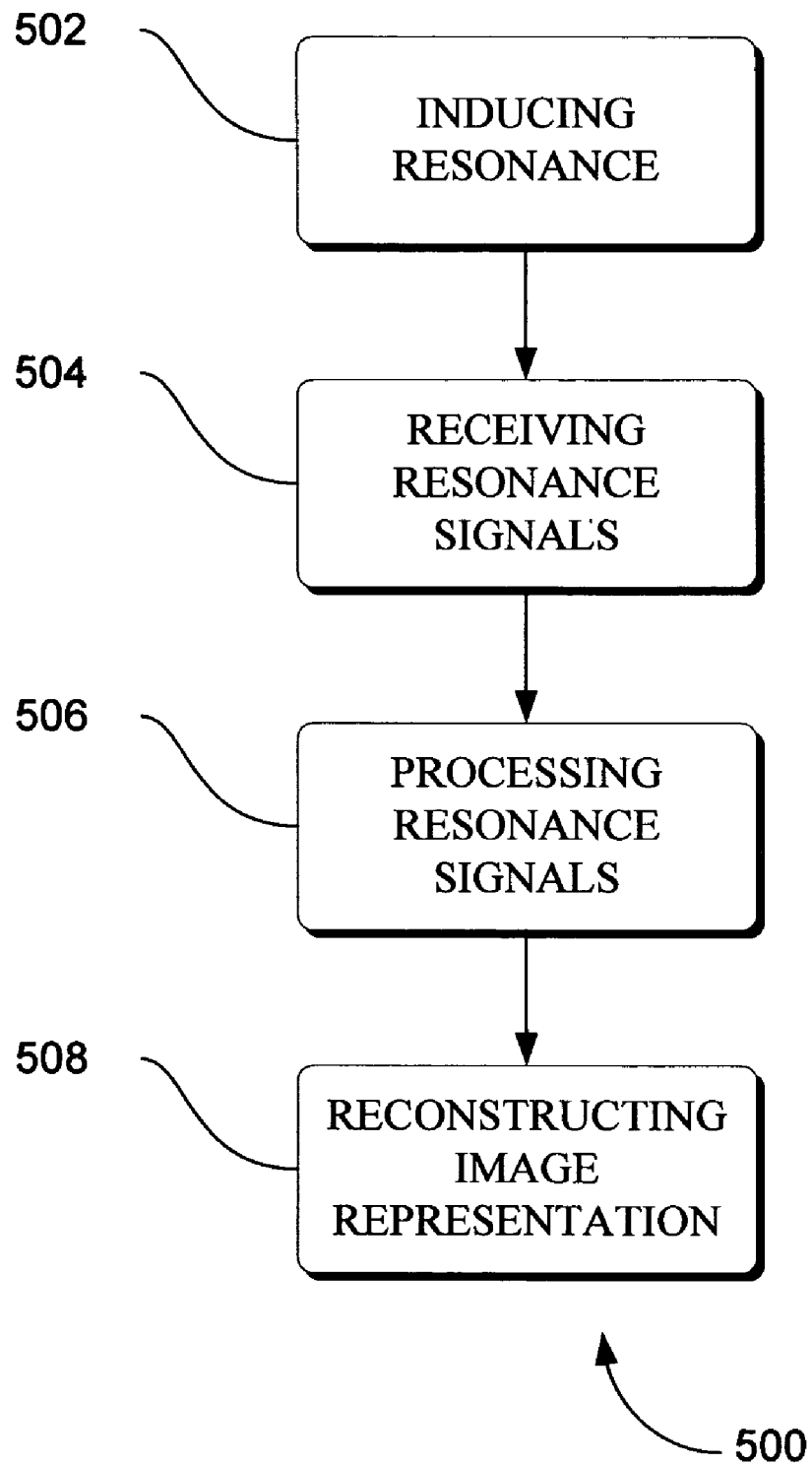
FIG. 5 is a flowchart of a method of magnetic resonance imaging, according to an embodiment.

FIG. 5 illustrates a method 500 for performing magnetic resonance imaging, according to an embodiment. Action 502 begins the process by inducing a subject, patient, or part of a subject 106 with electromagnetic energy that would cause resonance within the imaging area.

In action 504 the resonance signal is received by a computer or controller 410, workstation 414, or any known of future developed data processing equipment.

In action 506, the resonance signals are processed by the computer 410 or 514 so as to derive information. The computer system 410 includes a number of modules which communicate with each other through a backplane. These modules could be image processor module, a CPU module and a memory module, known in the art as a frame buffer for storing image data arrays.

In action 508, a reconstruction of an image is reproduced. The reproduction can be on a display 622, printer, or storage device.

FIG. 6 is a block diagram of the hardware and operating environment 600 in which different embodiments can be practiced. The description of FIG. 6 provides an overview of computer hardware and a suitable computing environment in conjunction with which some embodiments can be implemented. Embodiments are described in terms of a computer executing computer-executable instructions. However, some embodiments can be implemented entirely in computer hardware in which the computer-executable instructions are implemented in read-only memory. Some embodiments can also be implemented in client/server computing environments where remote devices that perform tasks are linked through a communications network. Program modules can be located in both local and remote memory storage devices in a distributed computing environment.

Computer 414 includes a processor 604, commercially available from Intel, Motorola, Cyrix and others. Computer 414 also includes random-access memory (RAM) 606, read-only memory (ROM) 608, and one or more mass storage devices 610, and a system bus 612, that operatively couples various system components to the processing unit 604. The memory 606, 608, and mass storage devices, 610, are types of computer-accessible media. Mass storage devices 610 are more specifically types of nonvolatile computer-accessible media and can include one or more hard disk drives, floppy disk drives, optical disk drives, and tape cartridge drives. The processor 604 executes computer programs stored on the computer-accessible media.

Computer 414 can be communicatively connected to the Internet 614 via a communication device 616. Internet 614 connectivity is well known within the art. In one embodiment, a communication device 616 is a modem that responds to communication drivers to connect to the Internet via what is known in the art as a "dial-up connection." In another embodiment, a communication device 616 is an Ethernet® or similar hardware network card connected to a local-area network (LAN) that itself is connected to the Internet via what is known in the art as a "direct connection" (e.g., T1 line, etc.).

A user enters commands and information into the computer 414 through input devices such as a keyboard 618 or a pointing device 620. The keyboard 618 permits entry of textual information into computer 414, as known within the art, and embodiments are not limited to any particular type of keyboard. Pointing device 620 permits the control of the screen pointer provided by a graphical user interface (GUI) of operating systems such as versions of Microsoft Windows®. Embodiments are not limited to any particular pointing device 620. Such pointing devices include mice, touch pads, trackballs, remote controls and point sticks. Other input devices (not shown) can include a microphone, joystick, game pad, satellite dish, scanner, or the like.

In some embodiments, computer 414 is operatively coupled to a display device 622. Display device 622 is connected to the system bus 612. Display device 622 permits the display of information, including computer, video and other information, for viewing by a user of the computer. Embodiments are not limited to any particular display device 622. Such display devices include cathode ray tube (CRT) displays (monitors), as well as flat panel displays such as liquid crystal displays (LCD's). In addition to a monitor, computers typically include other peripheral input/output devices such as printers (not shown). Speakers 624 and 626 provide audio output of signals. Speakers 624 and 626 are also connected to the system bus 612.

Computer 414 also includes an operating system (not shown) that is stored on the computer-accessible media RAM 606, ROM 608, and mass storage device 610, and is and executed by the processor 604. Examples of operating systems include Microsoft Windows®, Apple MacOS®, Linux®, UNIX®. Examples are not limited to any particular operating system, however, and the construction and use of such operating systems are well known within the art.

Embodiments of computer 414 are not limited to any type of computer 602. In varying embodiments, computer 602 comprises a PC-compatible computer, a MacOS®-compatible computer, a Linux®-compatible computer, or a UNIX®-compatible computer. The construction and operation of such computers are well known within the art.

Computer 414 can be operated using at least one operating system to provide a graphical user interface (GUI) including a user-controllable pointer. Computer 414 can have at least one web browser application program executing within at least one operating system, to permit users of computer 602 to access intranet or Internet world-wide-web pages as addressed by Universal Resource Locator (URL) addresses. Examples of browser application programs include Netscape Navigator® and Microsoft Internet Explorer®.

The computer 414 can operate in a networked environment using logical connections to one or more remote computers, such as controller 410. These logical connections are achieved by a communication device coupled to, or a part of, the computer 414. Embodiments are not limited to a particular type of communications device. The remote computer 410 can be another computer, a controller, a microcontroller, a server, a router, a network PC, a client, a peer device or other common network node. The logical connections depicted in FIG. 6 include a local-area network (LAN) 630 and a wide-area network (WAN) 632. Such networking environments are commonplace in offices, enterprise-wide computer networks, intranets and the Internet.

When used in a LAN-networking environment, the computer 414 and remote computer 410 are connected to the local network 630 through network interfaces or adapters 634, which is one type of communications device 616. Remote computer 628 also includes a network device 636. When used in a conventional WAN-networking environment, the computer 414 and remote computer 410 communicate with a WAN 632 through modems (not shown). The modem, which can be internal or external, is connected to the system bus 612. In a networked environment, program modules depicted relative to the computer 414, or portions thereof, can be stored in the remote computer 410.

Computer 414 also includes power supply 638. Each power supply can be a battery.

CONCLUSION

A MRI system has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future MRI system devices, different magnets, and new materials for performing magnetic resonance imaging functions.

We claim:

1. An apparatus comprising:
   a casing having an inner bore, said inner bore having a first end and a second end;
   an assembly disposed in said casing for creating a uniform field in the inner bore of said casing;
   a first access plane at said first end of said inner bore that is within a first distance from said uniform field; and
   a second access plane at said second end of said inner bore that is within a second distance from said uniform field, wherein the first distance is about the length of an average adult leg above the knee and the second distance is about the length of an average adult arm above the elbow.

2. The apparatus of claim 1, wherein the inner bore further comprises a substantially frustoconical shape.

3. The apparatus of claim 2, wherein the first access plane coincides with the widest diameter of the frustoconical shape.

4. The apparatus of claim 3, wherein the first access plane diameter is larger than the diameter of the second access plane.

5. The apparatus of claim 3, wherein the second access plane coincides with the narrowest diameter of the frustoconical shape; and the first distance is longer than the second distance.

6. The apparatus of claim 5, wherein the first set of magnets disposed in the casing further comprise a plurality of magnetic field generating devices of same or of different diameter.

7. The apparatus of claim 1, wherein the first set of magnets disposed in the casing further comprise a plurality of magnetic field generating devices of same or of different diameter.

8. The apparatus of claim 7, wherein each of the plurality of the magnetic field generating devices is one of superconducting coils, resistive coils, permanent magnets, superconducting coils or resistive coils and ferromagnetic elements, permanent magnets and ferromagnetic elements.

9. The apparatus of claim 7, wherein the assembly disposed in the casing further comprise:
   a gradient assembly positioned about an imaging axis along the inner bore to produce a substantially linear magnetic field within imaging region;
   a radio frequency system controlled by a pulse module to transmit radio frequency signals to a radio frequency coil assembly to acquire magnetic resonance images of a field-of-view formed by the uniform field; and,
   a controller operable to selectively energize the gradient assembly to generate a gradient field about the field-of-view.

10. The apparatus of claim 1 further comprising a second set of magnets having a pair of bucking coils positioned around the first set of magnets.

11. An apparatus for magnetic resonance imaging of different extremities, the apparatus comprising:
   a casing having an inner bore, the inner bore having a first end and second end at an outer edge of the casing;
   a first set of magnets disposed in casing for creating a magnetic field within the casing;
   an assembly disposed in the casing for creating a uniform field in the inner bore of the casing from the created magnetic field;
   a first access plane at the first end of the inner bore that is within a first distance from the uniform field for imaging larger extremities;
   a recess at the first access plane for receiving part of a gradient coil, wherein the inserted part of the gradient coil in combination with the assembly disposed in the casing affect the created magnetic field;
   a second access plane at the second end of the inner bore that is within a second distance from the uniform field for imaging shorter extremities, wherein the first distance is not greater than about the length of an average adult leg above the knee and the second distance is not greater than about the length of an average adult arm above the elbow.

12. The apparatus of claim 11, wherein the inner bore further comprises a substantially frustoconical shape.

13. The apparatus of claim 12, wherein the first access plane coincides with the widest diameter of the frustoconical shape.

14. The apparatus of claim 11, wherein the first access plane further comprises a diameter that is larger than the diameter of the second access plane.

15. The apparatus of claim 11, wherein the apparatus further comprises:
   the second access plane coincides with the narrowest diameter of the frustoconical shape; and
   the first distance further comprises a longer distance than the second distance.-

16. The apparatus of claim 11, wherein the apparatus further comprises: the magnet disposed in the casing comprises a plurality of coils of different diameters.

17. The apparatus of claim 16, wherein the apparatus further comprises:

the assembly disposed in the casing having a gradient coil assembly positioned about an imaging axis along the inner bore to produce a substantially linear magnetic field within imaging region, the assembly further comprising a radio frequency system controlled by a pulse module to transmit radio frequency signals to a radio frequency coil assembly to acquire magnetic resonance images of a field-of-view formed by the uniform field; and a controller to selectively energize the gradient coils to generate a substantially linear field about the field-of-view.

18. The apparatus of claim 11, wherein the second set of magnets comprise a pair of bucking coils positioned about the imaging axis.

19. The apparatus of claim 11, wherein the first set of magnets disposed in the casing further comprise a plurality of magnetic field generating devices of same or of different diameter.

20. An apparatus comprising:

a casing having an inner bore, the inner bore having a longitudinal axis and having a first end and a second end at opposite outer edges of the casing;

a first access plane at the first end of the inner bore;

a second access plane at the second end of the inner bore;

the inner bore having linear slope between the first access plane and the second access plane;

a gradient coil in the casing, the gradient coil being operable to create a field of view in the inner bore, the field of view having a center, the center being a distance from the first end that is not greater than about the length of an average adult leg above the knee and the center being a distance from the second end that is not greater than about the length of an average adult arm above the elbow.

* * * * *